(12) United States Patent
Matsuura (10) Patent No.: US 12,402,397 B2
(45) Date of Patent: Aug. 26, 2025

(54) SEMICONDUCTOR DEVICE

(71) Applicant: RENESAS ELECTRONICS CORPORATION, Tokyo (JP)

(72) Inventor: Hitoshi Matsuura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 443 days.

(21) Appl. No.: 17/892,660

(22) Filed: Aug. 22, 2022

(65) Prior Publication Data

US 2023/0127197 A1 Apr. 27, 2023

(30) Foreign Application Priority Data

Oct. 26, 2021 (JP) .................. 2021-174400

(51) Int. Cl.
*H10D 84/60* (2025.01)
*H01L 21/265* (2006.01)
*H10D 12/00* (2025.01)
*H10D 12/01* (2025.01)

(52) U.S. Cl.
CPC ..... *H10D 84/617* (2025.01); *H01L 21/26513* (2013.01); *H10D 12/038* (2025.01); *H10D 12/481* (2025.01)

(58) Field of Classification Search
CPC .......... H01L 21/26513; H10D 8/411; H10D 12/038; H10D 12/411; H10D 62/142; H10D 64/23; H10D 84/617; H10D 84/811
USPC .......... 257/140
See application file for complete search history.

(56) References Cited

U.S. PATENT DOCUMENTS

| 8,829,519 | B2 | 9/2014 | Fujii | |
|---|---|---|---|---|
| 9,620,631 | B2 | 4/2017 | Matsudai et al. | |
| 10,170,606 | B2 | 1/2019 | Shinsho | |
| 10,256,232 | B2 | 4/2019 | Senoo | |
| 2016/0043073 | A1* | 2/2016 | Tamura | H10D 84/617 257/140 |

(Continued)

FOREIGN PATENT DOCUMENTS

| JP | 2000-012551 A | 1/2000 |
|---|---|---|
| JP | 2001-501037 A | 1/2001 |

(Continued)

OTHER PUBLICATIONS

Office Action dated Dec. 10, 2024, from corresponding Japanese Application No. 2021-174400, 8 pages.

*Primary Examiner* — Fazli Erdem
(74) *Attorney, Agent, or Firm* — Rimon P.C.

(57) ABSTRACT

A semiconductor device includes a semiconductor substrate, a gate insulating film, a gate, and a first polysilicon film. The semiconductor substrate has a first main surface and a second main surface that is an opposite surface of the first main surface. The semiconductor substrate has a first portion and a second portion. The semiconductor substrate is a collector region arranged on the second main surface located in the first portion, a cathode region arranged on the second main surface located in the second portion, a drift region arranged on the collector region and the cathode region, an emitter region arranged on the first main surface located in the first portion, a base region arranged between the emitter region and the collector region, and an anode region arranged on the first main surface located in the second portion.

7 Claims, 10 Drawing Sheets

(56) References Cited

U.S. PATENT DOCUMENTS

2017/0047321 A1\* 2/2017 Nishimura ............... H10D 8/00

FOREIGN PATENT DOCUMENTS

| JP | 2009-076642 A | 4/2009 |
| JP | 2014-056942 A | 3/2014 |
| JP | 2018-137392 A | 8/2018 |
| JP | 2021-093556 A | 6/2021 |
| WO | 1998013861 A1 | 4/1998 |

\* cited by examiner

SEMICONDUCTOR DEVICE

CROSS-REFERENCE TO RELATED APPLICATIONS

The present application claims priority from Japanese Patent Application No. 2021-174400 filed on Oct. 26, 2021, the content of which is hereby incorporated by reference to this application.

BACKGROUND

The present disclosure relates to a semiconductor device.

A semiconductor device disclosed in Japanese patent application laid-open No. 2021-093556 (Patent Document 1) has a reverse conducting insulated gate bipolar transistor (RC-IGBT). The semiconductor device disclosed in Patent Document 1 includes a semiconductor substrate, a gate insulating film, and a gate.

The semiconductor substrate has a first main surface and a second main surface. The second main surface is an opposite surface of the first main surface. The semiconductor substrate has a collector region, a cathode region, a buffer region, a drift region, an emitter region, a base region, and a contact region.

The collector region is located on the second main surface. However, instead of the collector region, the cathode region is partially arranged thereon. The buffer region is arranged on the collector region and the cathode region. The drift region is arranged on the buffer region. The collector region is arranged on the first main surface. The base region is arranged between the drift region and the emitter region. The contact region is arranged within the base region. Each conductive type of the cathode region, the buffer region, the drift region, and the emitter region is an n-type. Each conductive type of the collector region, the base region, and the contact region is a p-type. A dopant concentration in the contact region is higher than a dopant concentration in the base region.

A gate trench is formed in the first main surface. The gate trench extends from the first main surface toward a second main surface side. The emitter region, base region and drift region are exposed from a side surface of the gate trench.

The gate is embedded in the gate trench. A gate insulating film is arranged between each of the side surface and a bottom surface of the gate trench and the gate. Consequently, a portion of the base region, which is sandwiched between the emitter region and the drift region, interposes the gate insulating film to oppose the gate. The emitter region, base region, drift region, buffer region, collector region, gate insulating film, and gate constitute an IGBT (Gate insulated Bipolar Transistor). The contact region, base region, drift region, buffer region, and cathode region constitute a body diode. The contact region and the base region constitute an anode of this body diode.

SUMMARY

However, since the dopant concentration in the contact region is higher than the dopant concentration in the base region, the above-mentioned body diode has high hole injection efficiency from the anode and a recovery loss is increased. Further, since the contact region has a function of suppressing an operation of a parasitic npn bipolar transistor composed of the emitter region, the base region and the drift region, it is difficult to reduce the dopant concentration.

The present disclosure provides a semiconductor device having an IGBT and a body diode in which a recovery loss is improved.

Other problems and novel features will become apparent from the description and accompanying drawings herein.

A semiconductor device according to one embodiment includes a semiconductor substrate, a gate insulating film; a gate, and a first polysilicon film. The semiconductor substrate has a first main surface and a second main surface that is an opposite surface of the first main surface. The semiconductor substrate has a first portion and a second portion. The semiconductor substrate has: a collector region arranged on the second main surface located in the first portion; a cathode region arranged on the second main surface located in the second portion; a drift region arranged on the collector region and the cathode region; an emitter region arranged on the first main surface located in the first portion; a base region arranged between the emitter region and the collector region; and an anode region arranged on the first main surface located in the second portion. The gate is arranged so as to interpose the gate insulating film and oppose a portion of the base region sandwiched between the emitter region and the drift region. The first polysilicon film is arranged on the anode region. Each conductive type of the emitter region, the emitter region, and the cathode region is an n-type. Each conductive type of the collector region, the base region, the anode region, and the first polysilicon film is a p-type.

According to the semiconductor device according to one embodiment, the recovery loss of the body diode can be improved.

DETAILED DESCRIPTION

Embodiments of the present disclosure will be described in detail with reference to the accompanying drawings. In the below-mentioned drawings, components having the same function are denoted by the same reference characters, and an overlapping description thereof will not be repeated.

First Embodiment

A semiconductor device according to a first embodiment will be described. The semiconductor device according to the first embodiment is referred to as a semiconductor device DEV1.

<Configuration of Semiconductor Device DEV1>

Hereinafter, a configuration of the semiconductor device DEV1 will be described.

Figure 1:
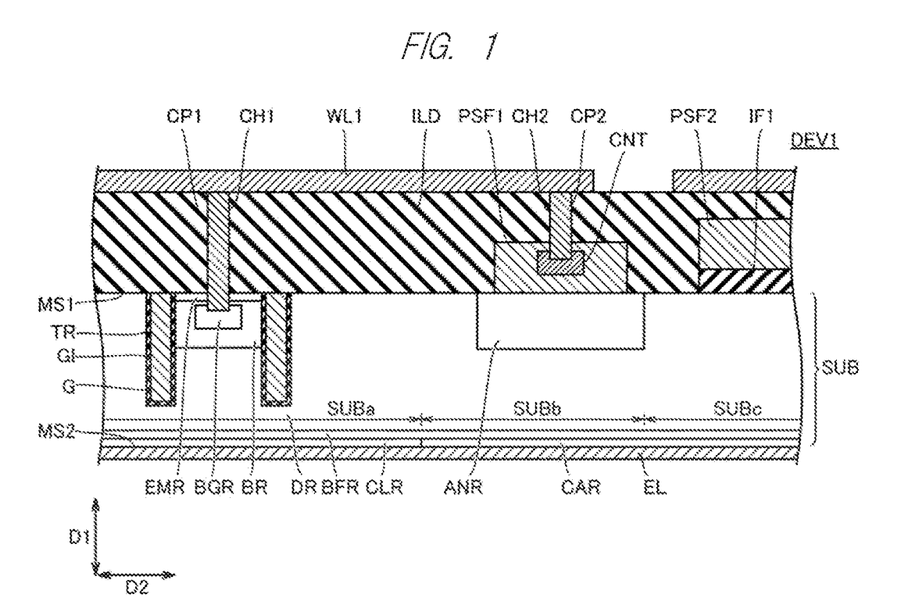
FIG. 1 is a sectional view of a semiconductor device DEV1.

FIG. 1 is a sectional view of the semiconductor device DEV1. As shown in FIG. 1, the semiconductor device DEV1 includes a semiconductor substrate SUE, a gate insulating film GI, a gate C, an insulating film IF1, a polysilicon film PSF1, a polysilicon film PSF2, an interlayer dielectric (interlayer insulating film) ILD, a contact plug CP1, a contact plug CP2, a wiring WL1, and an electrode EL.

The semiconductor substrate SUB has a first main surface MS1 and a second main surface MS2. The first main surface MS1 and the second main surface MS2 are end faces of the semiconductor substrate SUB in a thickness direction. The second main surface MS2 is an opposite surface of the first main surface MS1. Incidentally, a thickness direction of the semiconductor substrate SUB is defined as a first direction D1. The semiconductor substrate SUB is formed of, for example, monocrystalline silicon (Si).

The semiconductor substrate SUE has a first portion SUBa, a second portion SUBb, and a third portion SUBc. The first portion SUBa and the second portion SUBb are adjacent to each other in a second direction D2. The second direction D2 is a direction orthogonal to the first direction D1. The number of first portions SUBa and second portions SUBb may be two or more. A plurality of first portions SUBa and second portions SUBb are alternately arranged in the second direction D2. The third portion SUBc is adjacent to the second portion SUBb from an opposite side of the first portion SUBa, for example, in the second direction D2.

The semiconductor substrate SUB has a collector region CLR, a cathode region CAR, a buffer region BFR, a drift region DR, an emitter region EMR, a base region BR, a back gate region BCG, and an anode region ANR. Each conductive type of the cathode region CAR, buffer region BFR, drift region DR, and emitter region EMR is an n-type. Each conductive type of the collector region CLR, base region BR, back gate region BGR, and anode region ANR is a p-type. Dopant concentrations in the cathode region CAR and the emitter region EMR are higher than a dopant concentration in the buffer region BFR. A dopant concentration in the buffer region BFR is higher than a dopant concentration in the drift region DR. A dopant concentration in the back gate region BGR is higher than a dopant concentration in the base region BR. The dopant concentration in the base region BR is higher than the dopant concentration in the anode region ANR.

The collector region CLR and the cathode region CAR are arranged on the second main surface MS2. More specifically, the collector region CLR is arranged on the second main surface MS2 located in the first portion SUBa, and the cathode region CAR is arranged on the second main surface MS2 located in the second portion SUBb and the third portion SUBc.

The buffer region BFR is arranged on the collector region CLE and the cathode region CAR. The drift region DR is arranged on the buffer region BFR. That is, the drift region DR interposes the buffer region BFR to be arranged on the collector region CLR and the cathode region CAR. The emitter region EMR is arranged on the first main surface MS1 located in the first portion SUBa. The base region BR is arranged between the emitter region EMR and the drift region DR.

The back gate region BGR is arranged in the base region BR. The anode region ANR is arranged on the first main surface MS1 located in the second portion SUBb. Incidentally, a body diode is configured by pn-junction the anode region ANR and the drift region DR.

A gate trench TR is formed in the first main surface MS1 located in the first portion SUBa. The gate trench TR extends from the first main surface MS1 toward the second main surface MS2 along the first direction D1. The emitter region EMR, base region BR, and drift region DR are exposed from a side surface of the gate trench TR.

The gate G is embedded in the gate trench TR, The gate G is formed of, for example, polysilicon containing a dopant. The gate insulating film GI is arranged between the gate G and each of the side surface and a bottom surface of the gate trench TR. Consequently, the gate G interposes the gate insulating film GI to oppose a portion of the base region BR sandwiched between the emitter region EMR and the drift region DR. The gate insulating film GI is formed of, for example, silicon oxide ($SiO_2$). Incidentally, the emitter region EMR, base region BR, drift region DR, buffer region BFR, and collector region CLR constitute an IGBT.

The insulating film IF1 is arranged on the first main surface MS1. More specifically, the insulating film IF1 is arranged on the first main surface MS1 located in the third portion SUBc. The insulating film IF1 is formed of, for example, silicon oxide.

The polysilicon film PSF1 is arranged on the anode region ANR. The polysilicon film PSF1 is formed of polycrystalline silicon containing a dopant. A conductive type of the polysilicon film PSF1 is a p-type. The polysilicon film PSF1 is electrically connected to the anode region ANR.

Incidentally, a dopant concentration in the polysilicon film PSF1 is higher than a dopant concentration in the anode region ANR. The contact region CTR is arranged in the polysilicon film PSF1. A dopant concentration in the contact region CTR is higher than the dopant concentration in the polysilicon film PSF1 other than the contact region CTR.

The polysilicon film PSF2 interposes the insulating film IF1 to be arranged on the first main surface MS1 located in the third portion SUBc. Dopants are injected into the polysilicon film PSF2 according to a function to be imparted. The polysilicon film PSF2 functions, for example, as a resistor or a diode (more specifically, a temperature measurement diode).

An interlayer dielectric ILD is arranged on the first main surface MS1 so as to cover the insulating film IF1, the polysilicon film PSF1, and the polysilicon film PSF2. The interlayer dielectric ILD is formed of, for example, silicon oxide.

A contact hole CH1 and a contact hole CH2 are formed in the interlayer dielectric ILD, The contact hole CH1 penetrates the interlayer dielectric ILD along the first direction D1. The contact hole CH1 also reaches the semiconductor substrate SUB so as to expose the emitter region EMR and the back gate region BGR. The contact hole CH2 penetrates the interlayer dielectric ILD along the first direction D1. The contact hole CH2 also reaches the polysilicon film PSF1 so as to expose the contact region CTR.

A contact plug CP1 is embedded in the contact hole CH1, A lower end side of the contact plug CP1 is electrically connected to the emitter region EMR and the back gate region BGR. A contact plug CP2 is embedded in the contact hole CH2. A lower end side of the contact plug CP2 is electrically connected to the contact region CTR. The contact plug CP1 and the contact plug CP2 are formed of, for example, tungsten (W).

Although not shown, the semiconductor device DEV1 further has a contact plug CP3 and a contact hole CH3 is further formed in the interlayer dielectric ILD. The contact hole CH3 penetrates the interlayer dielectric ILD along the first direction D1 so as to expose the gate G. The contact hole CH3 may reach the gate G. The contact plug CP3 is embedded in the contact hole CH3. A lower end side of the contact plug CP3 is electrically connected to the gate G. The contact plug CP3 is formed of, for example, tungsten.

The wiring WL1 is arranged on the interlayer dielectric ILD. The wiring WL1 is electrically connected to an upper end side of the contact plug CP1 and an upper end side of the contact plug CP2. The wiring WL1 is formed of, for example, aluminum (Al) or an aluminum alloy. Although not shown, the semiconductor device DEV1 further includes a wiring WL2. The wiring WL2 is arranged on the interlayer dielectric ILD, and is electrically connected to an upper end side of the contact plug CP3.

The electrode EL is arranged on the second main surface MS2. The electrode EL is electrically connected to the collector region CLR and the cathode region CAR. The electrode EL is formed of, for example, aluminum or an aluminum alloy.

<Manufacturing Method of Semiconductor Device DEV1>

Hereinafter, a manufacturing method of the semiconductor device DEV1 will be described.

Figure 2:
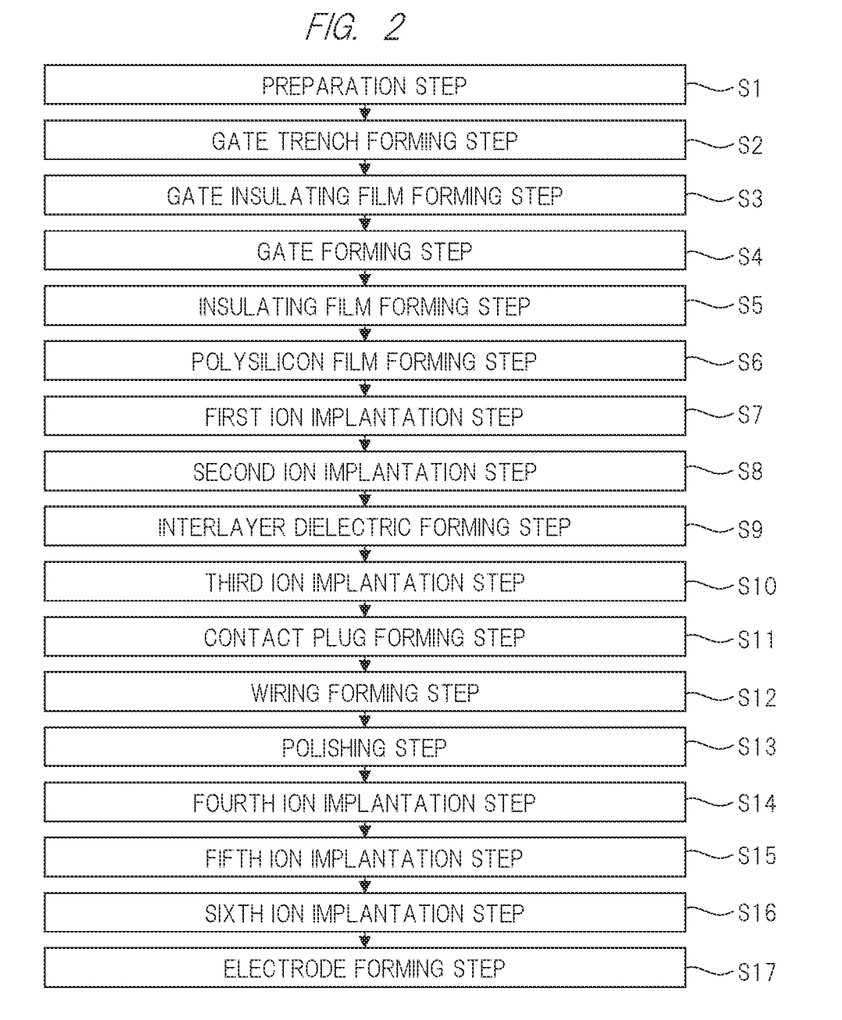
FIG. 2 is a process drawing showing a manufacturing method of the semiconductor device DEV1.

FIG. 2 is a process drawing showing a manufacturing method of the semiconductor device DEV1. As shown in FIG. 2, a manufacturing method of the semiconductor device DEV1 includes a preparation step S1, a gate trench forming step S2, a gate insulating film forming step S3, a gate forming step S4, an insulating film forming step S5, a polysilicon film forming step S6, a first ion implantation step S7, a second ion implantation step S8, an interlayer dielectric forming step S9, a third ion implantation step S10, a contact plug forming step S11, a wiring forming step S12, a polishing step S13, a fourth ion implantation step S14, a fifth ion implantation step S15, a sixth ion implantation step S16, and an electrode forming step S17.

Figure 3:
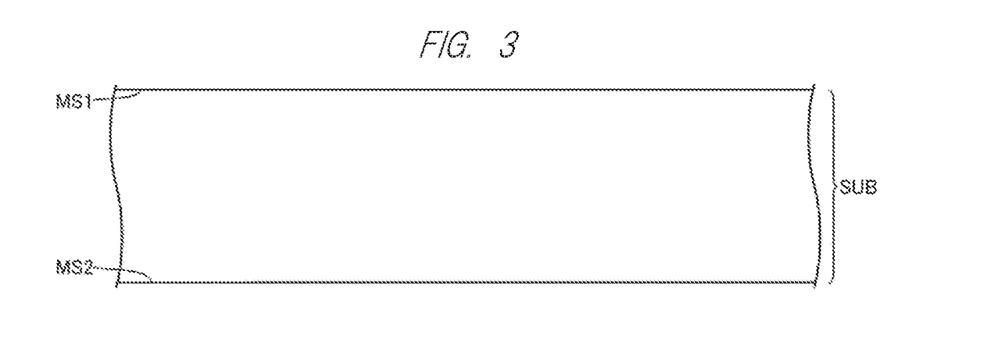
FIG. 3 is a sectional view for explaining a preparation step S1.

FIG. 3 is a sectional view for explaining a preparation step S1. As shown in FIG. 3, in the preparation step S1, the semiconductor substrate SUB is prepared. However, a thickness of the semiconductor substrate SUB prepared in the preparation step S1 is smaller than a thickness of the semiconductor substrate SUB that the semiconductor device DEV1 has. A conductive type of the semiconductor substrate SUB prepared in the preparation step S1 is an n-type.

Figure 4:
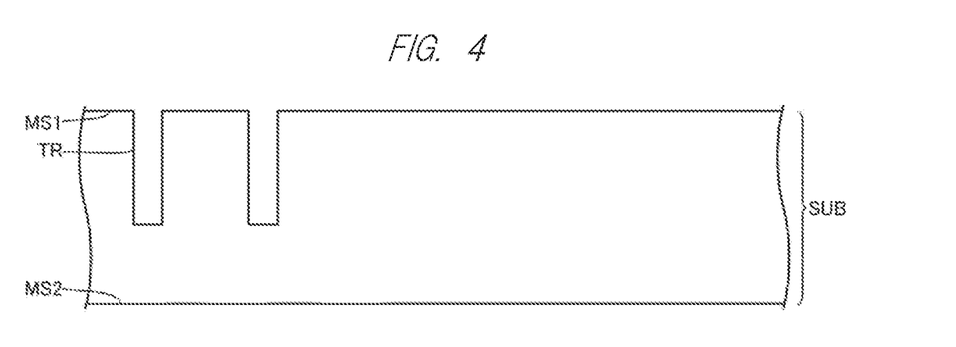
FIG. 4 is a sectional view for explaining a gate trench forming step S2.

FIG. 4 is a sectional view for explaining the gate trench forming step S2. In the gate trench forming step S2, the gate trench TR is formed as shown in FIG. 4. The gate trench TR is formed, for example, by etching using a hard mask arranged on the first main surface MS1.

Figure 5:
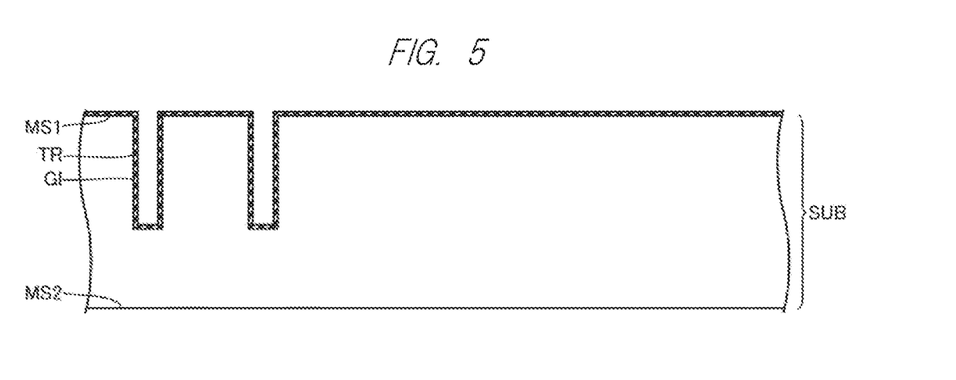
FIG. 5 is a sectional view for explaining a gate insulating film forming step S3.

FIG. 5 is a sectional view for explaining the gate insulating film forming step S3. As shown in FIG. 5, in the gate insulating film forming step S3, the gate insulating film GI is formed. The gate insulating film GI is formed, for example, by thermally oxidizing a first main surface MS1 side of the semiconductor substrate SUB.

Figure 6:
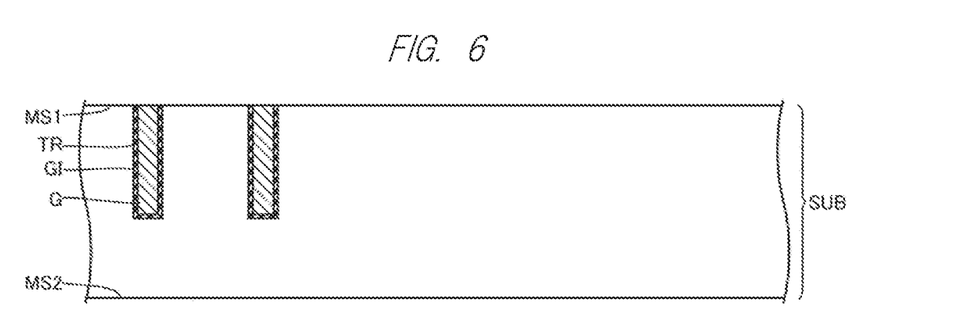
FIG. 6 is a sectional view for explaining a gate forming step S4.

FIG. 6 is a sectional view for explaining the gate forming step S4. As shown in FIG. 6, in the gate forming step S4, the gate G is formed. In the gate forming step S4, first, a constituent material of the gate G is embedded in the gate trench TA by, for example, CVD (Chemical Vapor Deposition). Second, the constituent material of the gate G protruding from the gate trench TA is removed by, for example, CMP (Chemical Mechanical Polishing). The constituent material of the gate G protruding from the gate trench TA may be removed by etch back.

Figure 7:
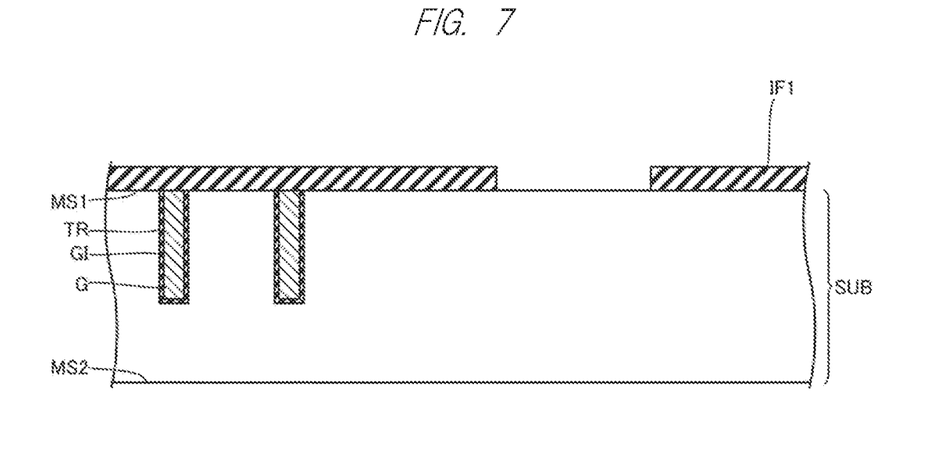
FIG. 7 is a sectional view for explaining an insulating film forming step S5.

FIG. 7 is a sectional view for explaining the insulating film forming step S5. As shown in FIG. 7, the insulating film IF1 is formed in the insulating film forming step S5. In the insulating film forming step S5, first, a constituent material of the insulating film IF1 is formed on the first main surface MS1 by CVD or the like. Second, the constituent material of the formed insulating film IF1 is etched by masking a resist formed by using photolithography. As described above, the insulating film IF1 having an opening is formed at a position at which the polysilicon film PSF1 is formed. Incidentally, after the above etching is performed, the first main surface MS1 is washed.

Figure 8:
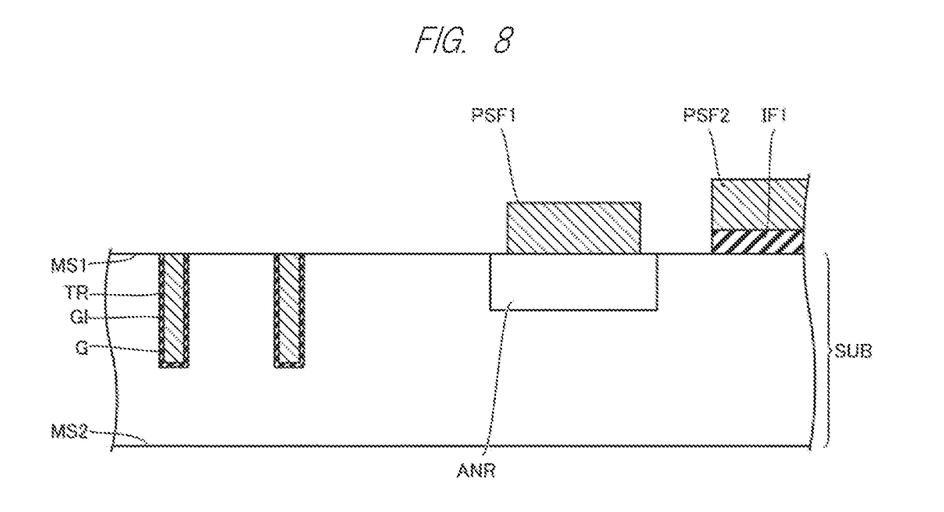
FIG. 8 is a sectional view for explaining a polysilicon film forming step S6.

FIG. 8 is a sectional view for explaining the polysilicon film forming step S6, As shown in FIG. 8, the polysilicon film PSF1, the polysilicon film PSF2, and the anode region ANR are formed. In the polysilicon film forming step S6, first, the polysilicon is formed on the first main surface MS1 so as to cover the insulating film IF1. Incidentally, this polysilicon is non-doped (does not contain a dopant). Second, a dopant is ion-implanted into the formed polysilicon. Third, a heat treatment is performed thereto. The dopant in the polysilicon formed by this heat treatment diffuses into the semiconductor substrate SUB, and the anode region ANR is formed. Fourth, the formed polysilicon is etched by using a resist formed by photolithography as a mask. As mentioned above, the polysilicon film PSF1 and the polysilicon film PSF2 are formed. Incidentally, after the polysilicon film PSF1, the polysilicon film PSF2, and the anode region ANR are formed, a portion of the insulating film IF1 other than a lower portion of the polysilicon film PSF2 is removed by etching.

Figure 9:
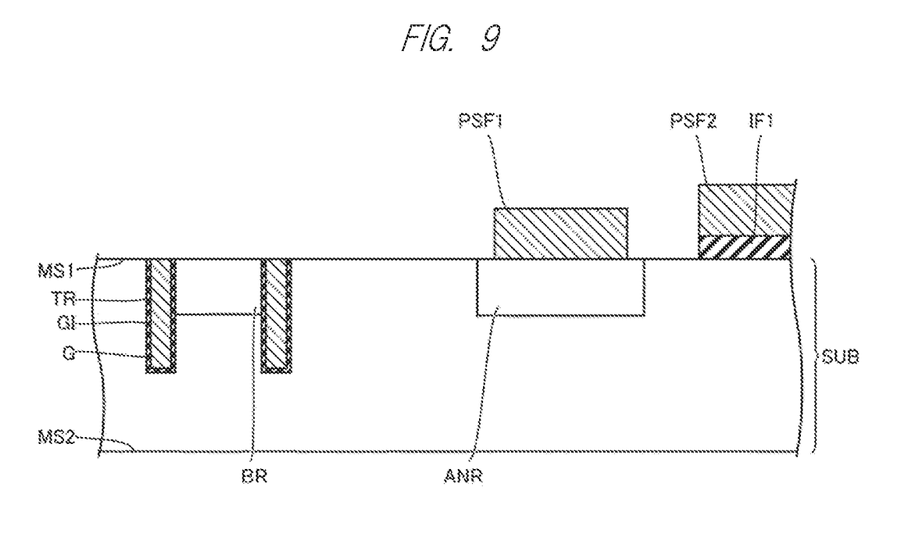
FIG. 9 is a sectional view for explaining a first ion implantation step S7.
Figure 10:
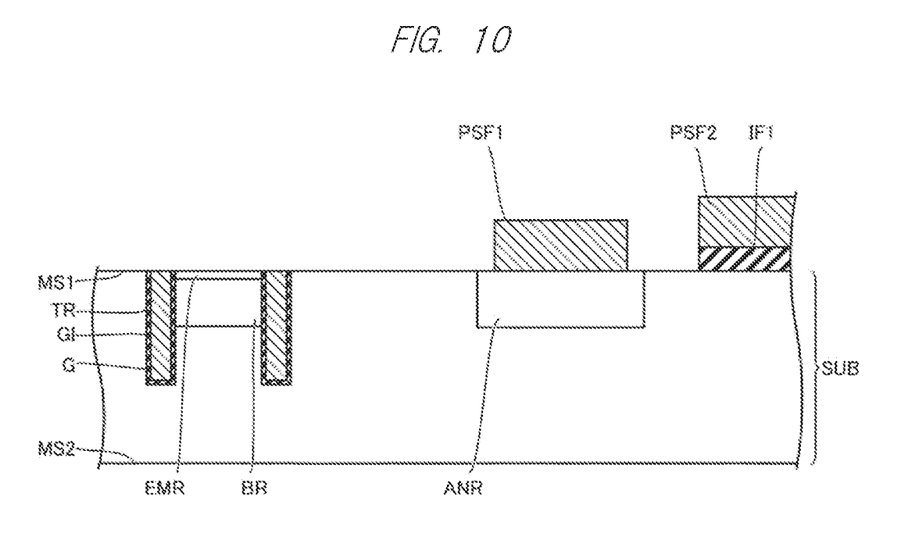
FIG. 10 is a sectional view for explaining a second ion implantation step S8.

FIG. 9 is a sectional view for explaining the first ion implantation step S7. In the first ion implantation step S7, as shown in FIG. 9, ion implantation is performed to form the base region BR. FIG. 10 is a sectional view for explaining the second ion implantation step S8. In the second ion implantation step S8, as shown in FIG. 10, the emitter region EMR is formed by performing ion implantation.

Figure 11:
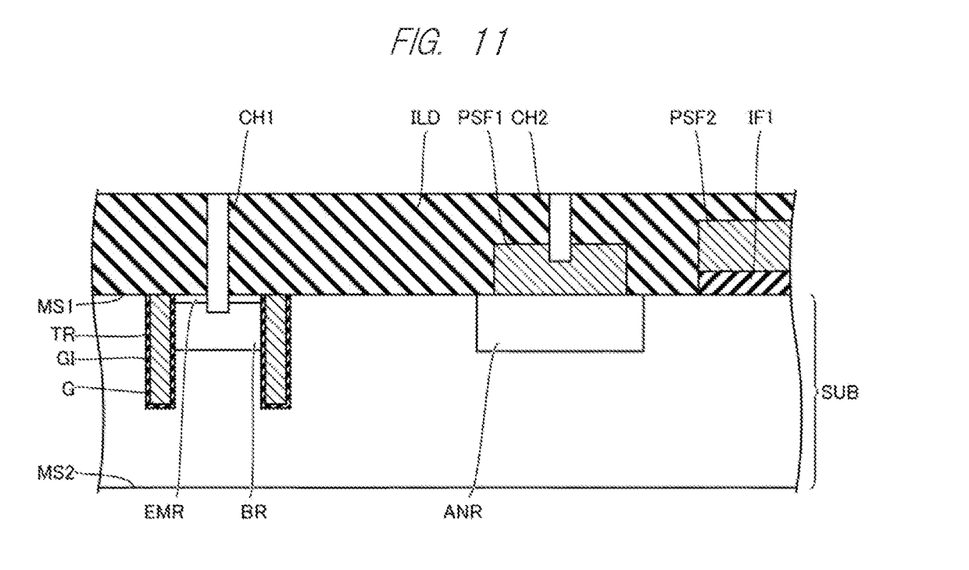
FIG. 11 is a sectional view for explaining an interlayer dielectric forming step S9.

FIG. 11 is a sectional view for explaining the interlayer dielectric film forming step S9. As shown in FIG. 11, in the interlayer insulating film forming step S9, the interlayer dielectric ILD is formed. In the interlayer dielectric forming step S9, first, a constituent material of the interlayer dielectric ILD is formed on the first main surface MS1 so as to cover the insulating film IF1, the polysilicon film PSF1, and the polysilicori film PSF2. Second, the constituent material of the formed interlayer dielectric ILD is flattened by, for example, CMP. Third, the contact hole CH1, the contact hole CH2, and the contact hole CH3 (not shown) are formed by etching the interlayer dielectric ILD, the etching using as a mask a resist formed by photolithography. As mentioned above, the interlayer dielectric ILD is formed.

Figure 12:
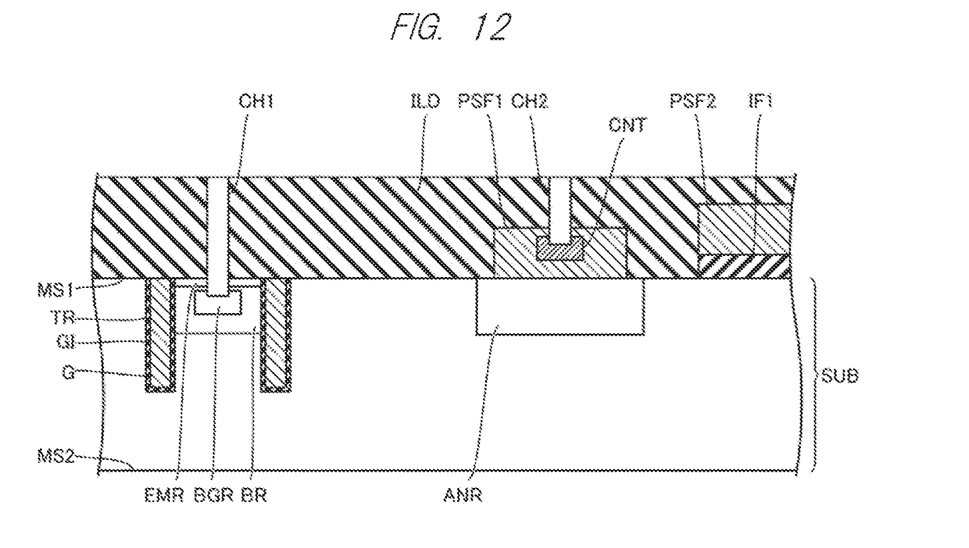
FIG. 12 is a sectional view for explaining a third ion implantation step S10.

FIG. 12 is a sectional view for explaining the third ion implantation step S10. As shown in FIG. 12, in the third ion implantation step S10, the back gate region BGR and the contact region CTR are formed by performing ion implantation. This ion implantation is performed through the contact hole CH1 and the contact hole CH2.

Figure 13:
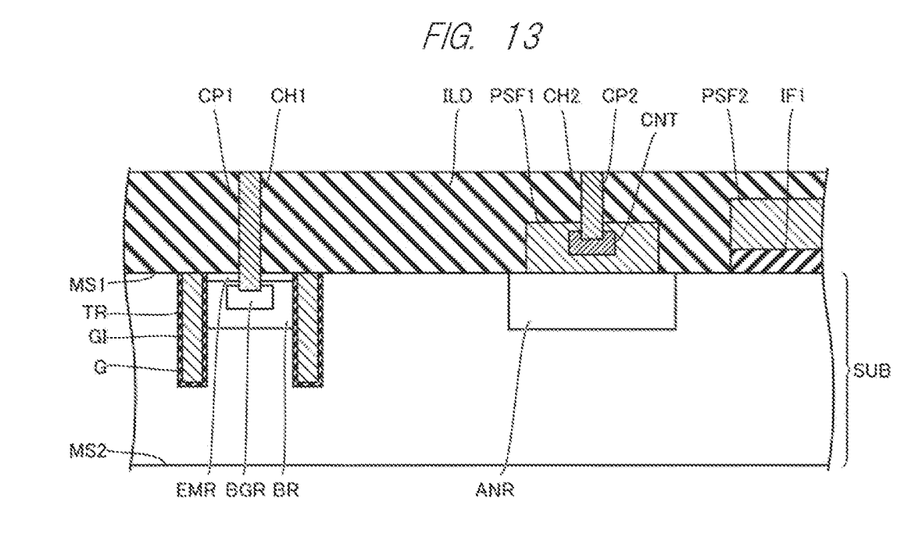
FIG. 13 is a sectional view for explaining a contact plug forming step S11.

FIG. 13 is a sectional view for explaining the contact plug forming step S10. As shown in FIG. 13, in the contact plug forming step S11, the contact plug CP1, the contact plug CP2, and the contact plug CP3 (not shown) are formed. In the contact plug forming step S11, first, constituent materials of the contact plugs (contact plug CP1, contact plug CP2, and contact plug CP3) are embedded in the contact hole CH1, contact hole CH2, and contact hole CH3 (not shown) by, for example, CVD. Second, the constituent materials of the contact plugs, which protrude from the contact hole CH1, the contact hole CH2, and the contact hole CH3, are removed by, for example, CMP. As mentioned above, the contact plug CP1, the contact plug CP2, and the contact plug CP3 are formed.

Figure 14:
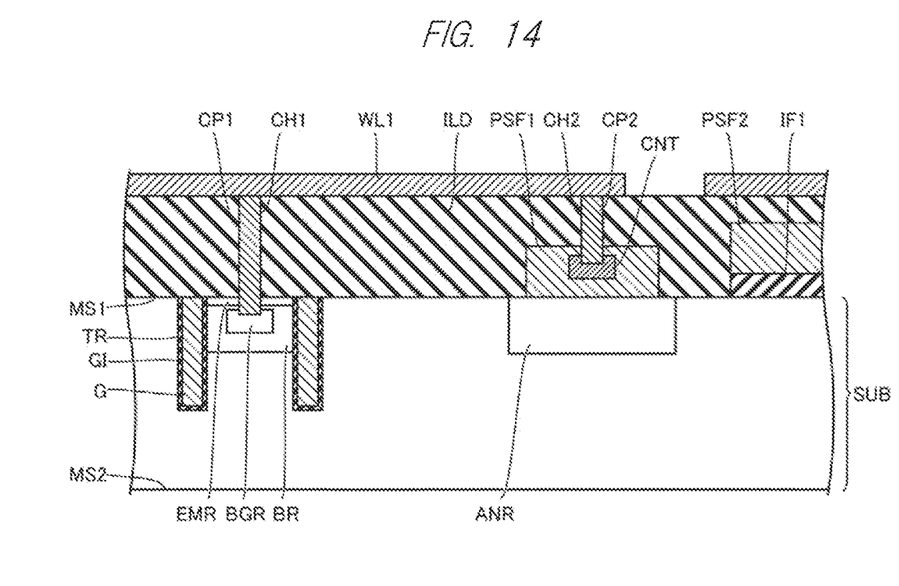
FIG. 14 is a sectional view for explaining a wiring forming step S12.

FIG. 14 is a sectional view for explaining the wiring forming step S12. As shown in FIG. 14, in the wiring forming step S12, the wiring WL1 and the wiring WL2 (not shown) are formed. In the wiring forming step S12, first, constituent materials of the wirings (wiring WL1 and wiring WL2) are formed on the interlayer dielectric ILD. Second, the constituent materials of the film-formed wirings are etched using a resist formed by photolithography as a mask. Consequently, the wiring WL1 and the wiring WL2 are formed.

Figure 15:
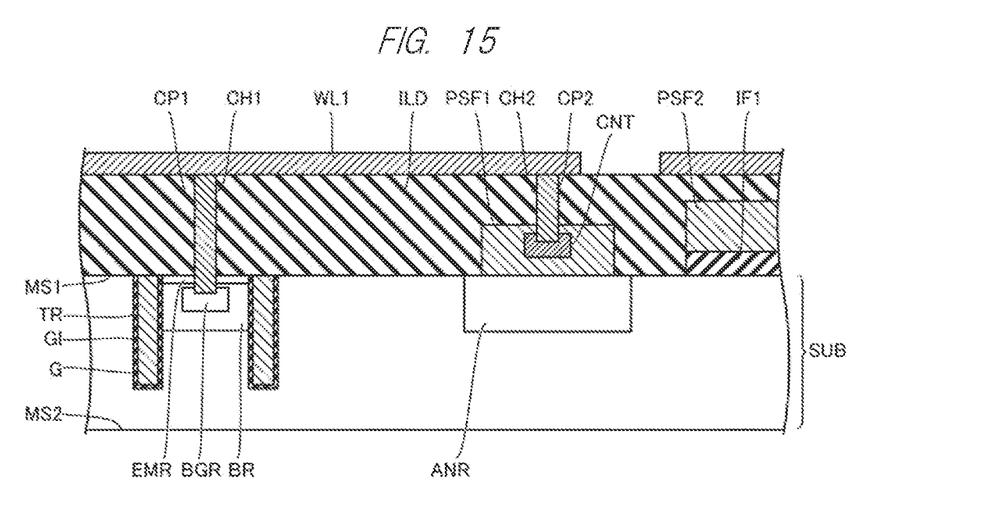
FIG. 15 is a sectional view for explaining a polishing step S13.
Figure 16:
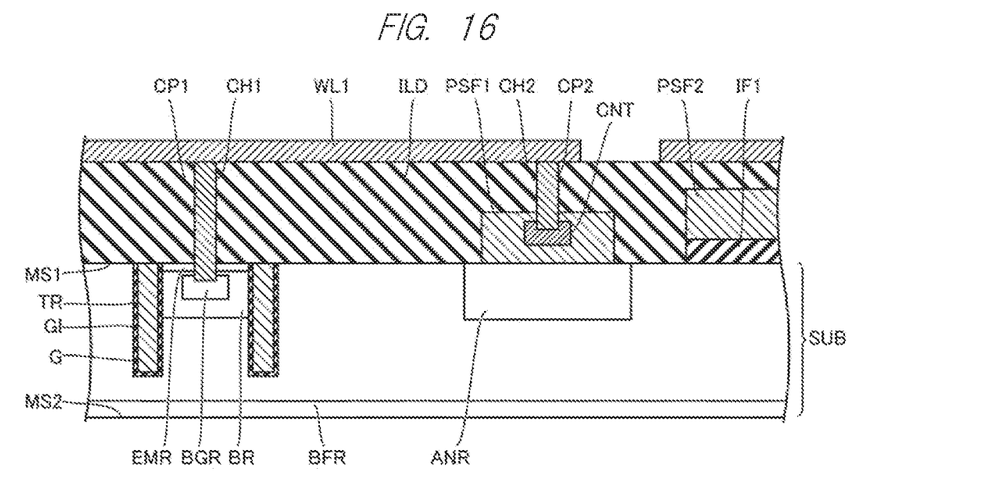
FIG. 16 is a sectional view for explaining a fourth ion implantation step S14.
Figure 17:
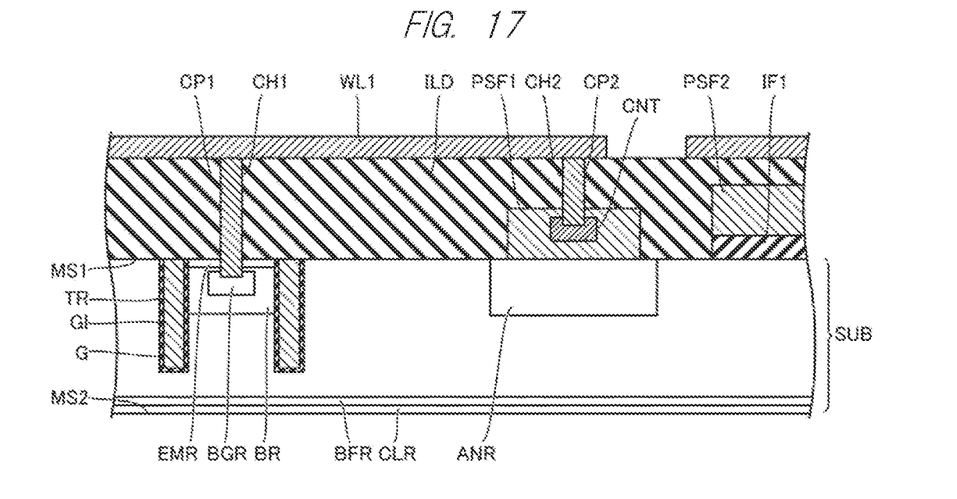
FIG. 17 is a sectional view for explaining a fifth ion implantation step S15on.

FIG. 15 is a sectional view for explaining the polishing step S13. As shown in FIG. 15, in the polishing step S13, a thickness of the semiconductor substrate SUE is reduced (becomes small) by polishing a second main surface MS2 side of the semiconductor substrate SUB. FIG. 16 is a sectional view for explaining the fourth ion implantation step S14. As shown in FIG. 16, in the fourth ion implantation step S14, the buffer region BFR is formed by ion implantation. FIG. 17 is a sectional view for explaining the fifth ion implantation step S15. As shown in FIG. 17, in the fifth ion implantation step S15, the collector region CLR is formed by ion implantation.

Figure 18:
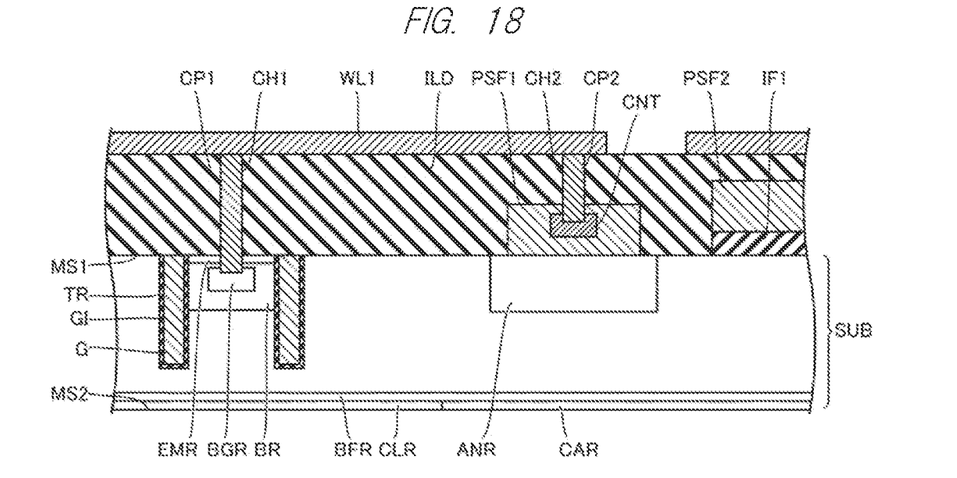
FIG. 18 is a sectional view for explaining a sixth ion implantation step S16.

FIG. 18 is a sectional view for explaining the sixth ion implantation step S16. As shown in FIG. 18, in the sixth ion implantation step S16, the cathode region CAR is formed. In the sixth ion implantation step S16, first, a resist is formed on the second main surface MS2. This resist is patterned by using photolithography so that only a portion at which the cathode region CAR is formed is open. Second, ion implantation is performed by using the above resist as a mask. Consequently, the cathode region CAR is formed. Incidentally, a portion of the semiconductor substrate SUB, to which the ion implantation is not performed, becomes the drift region DR.

In the electrode forming step S17, the electrode EL is formed on the second main surface MS2. The electrode EL is formed by, for example, sputtering. As mentioned above, the semiconductor device DEV1 having a structure shown in FIG. 1 is formed.

<Effect of Semiconductor Device DEV1>

Hereinafter, an effect(s) of the semiconductor device DEV1 will be described in comparison with a comparative example. A semiconductor device according to a comparative example is referred to as a semiconductor device DEV2.

Figure 19:
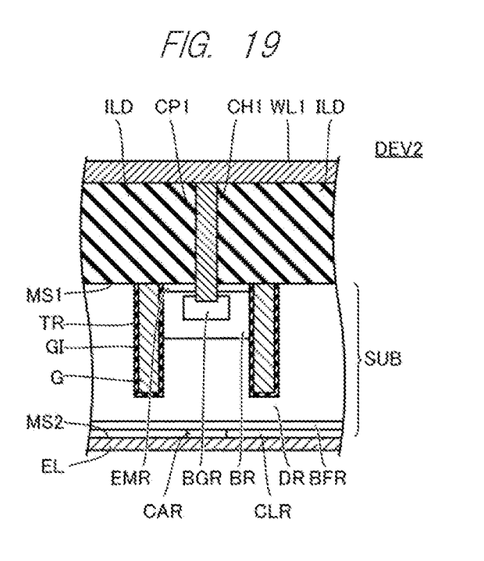
FIG. 19 is a sectional view of a semiconductor device DEV2.

FIG. 19 is a sectional view of a semiconductor device DEV2. As shown in FIG. 19, the semiconductor device DEV1 has a semiconductor substrate SUB, a gate insulating film GI, a gate G, an interlayer dielectric ILD, a contact CP1, and an electrode EL. Further, in the semiconductor device DEV2, the semiconductor substrate SUB has a collector region CLR, a buffer region BFR, a drift region DR, an emitter region EMR, a base region BR, a back gate region BGR, and a cathode region CAR.

In the semiconductor device DEV2, the cathode region CAR in place of the collector region CLR is arranged on the second main surface MS2 below the back gate region BGR. In the semiconductor device DEV2, the back gate region BGR, the base region BR, the drift region DR, and the cathode region CAR constitute a body diode. In the body diode of the semiconductor device DEV2, the anode has the back gate region BGR with a high dopant concentration, so that the hole injection efficiency to the cathode is high and a forward voltage can be lowered, but the recovery loss will be large.

Further, in the semiconductor device DEV2, when the dopant concentration in the back gate region BGR is lowered, the parasitic npn bipolar transistor configured by the emitter region EMR, the base region BR, and the drift region DR becomes easy to operate, which makes it difficult to lower (reduce) the dopant concentration in the back gate region BGR.

On the other hand, in the semiconductor device DEV1, the anode of the body diode is composed of the anode region. ANR. The anode region ANR is formed by diffusing the dopant from the polysilicon film PSF1. Consequently, in the semiconductor device DEV1, the dopant concentration in the anode region ANR can be lowered independently of the dopant concentration in the back gate region BGR. Thus, in the semiconductor device DEV1, the recovery loss of the body diode can be reduced while the operation of the parasitic npn bipolar transistor composed of the emitter region EMR, the base region BR, and the drift region DR is suppressed.

Further, in the semiconductor device DEV1, the polysilicon film PSF1 used for forming the anode region ANR is formed in the same step as that of the polysilicon film PSF2. Consequently, in the semiconductor device DEV1, the body diode in which the recovery loss is reduced is formed without adding a new step.

MODIFICATION EXAMPLE

In the above, a case where the IGBT that the semiconductor device DEV1 has is a trench gate type IGBT has been described as an example, but the IGBT that the semiconductor device DEV1 has may be a planar gate type IGBT.

Second Embodiment

A semiconductor device according to a second embodiment will be described. A semiconductor device according to a second embodiment is referred to as a semiconductor device DEV3. Here, a point different from the semiconductor DEV1 will mainly be described, and a description overlapping with the above will not be repeated.

<Configuration of Semiconductor Device DEV3>

Hereinafter, a configuration of a semiconductor device DEV3 will be described.

Figure 20:
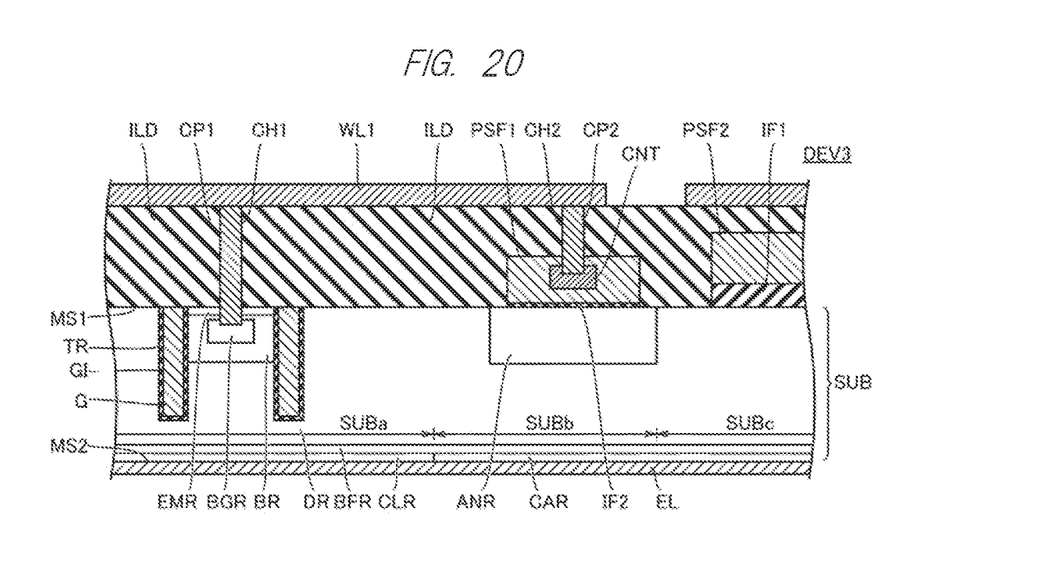
FIG. 20 is a sectional view of a semiconductor device DEV3.

FIG. 20 is a sectional view of a semiconductor device DEV3. As shown in FIG. 20, a semiconductor device DEV3 includes a semiconductor substrate SUE, a gate insulating film GI, a gate C, an insulating film IF1, a polysilicon film PSF1, a polysilicon film PSF2, and an interlayer dielectric ILD, a contact plug CP1, a contact plug CP2, a contact plug CP3 (not shown), a wiring WL1 and a wiring WL2 (not shown), and an electrode EL.

In the semiconductor device DEV3, the semiconductor substrate SUB has a collector region CLR, a cathode region CAR, a buffer region BFR, a drift region DR, an emitter region EMR, a base region ER, a back gate region BGR, and an anode region ANR. In these respects, a configuration of the semiconductor device DEV3 is common to the configuration of the semiconductor device DEV1.

The semiconductor device DEV3 further has an insulating film IF2. The insulating film IF2 is arranged between the anode region ANR and the polysilicon film PSF1. The insulating film IF2 is formed of, for example, silicon oxide. A thickness of the insulating film IF2 is preferably 5 nm or less from the viewpoint of suppressing difficulty being diffused into the semiconductor device DV1 by the dopant in the polysilicon film PSF1 and of suppressing the electrical insulation between the polysilicon film PSF1 and the anode region ANR. The thickness of the insulating film IF2 is more preferably 3 nm or less. In these respects, the configuration of the semiconductor device DEV2 is different from the configuration of the semiconductor device DEV1.

<Manufacturing Method of Semiconductor Device DEV3>

Hereinafter, a manufacturing method of a semiconductor device DEV3 will be described.

A manufacturing method of a semiconductor device DEV3 includes a preparation step S1, a gate trench forming step S2, a gate insulating film forming step S3, a gate forming step S4, an insulating film forming step S5, a polysilicon film forming step S6, a first ion implantation step S7, a second ion implantation step S8, and an interlayer dielectric forming step S9. The manufacturing method of the semiconductor device DEV3 further includes a third ion implantation step S10, a contact plug forming step S11, a wiring forming step S12, a polishing step S13, a fourth ion implantation step S14, a fifth ion implantation step S15, a sixth ion implantation step S16, and an electrode forming step S17. In this respect, the manufacturing method of the semiconductor device DEV3 is common to the manufacturing method of the semiconductor device DEV1.

In the insulating film forming step S5, after a constituent material(s) of the insulating film IF1 is etched, the first main surface MS1 is washed with, for example, APM (Ammonia-hydrogen Peroxide Mixture). Consequently, the insulating film IF2 is formed. In this respect, the manufacturing method of the semiconductor device DEV3 is different from the manufacturing method of the semiconductor device DEV1.

<Effect of Semiconductor Device DEV3>

Hereinafter, an effect (s) of a semiconductor device DEV3 will be described.

A barrier height (about 1.0 eV) of the insulating film IF2 to holes is higher than a barrier height (about 0.3 eV) of the insulating film IF2 to electrons. Consequently, in the semiconductor device DEV3, holes are less likely to move from the polysilicon film PSF1 to the body diode beyond the insulating film IF2, and the hole injection efficiency is further reduced. As a result, the semiconductor device DEV3 makes it possible to further reduce the recovery loss of the body diode.

In the foregoing, the invention made by the inventor of the present invention has been specifically described based on the embodiments. However, needless to say, the present invention is not limited to the foregoing embodiments and various modifications and alterations can be made within the scope of the present invention.

What is claimed is:

1. A semiconductor device comprising:
   a semiconductor substrate;
   a gate insulating film;
   a gate;
   a first polysilicon film;
   an interlayer dielectric arranged on the semiconductor substrate so as to cover the first polysilicon film; and
   a first contact hole formed in the interlayer dielectric,
   wherein the semiconductor substrate has a first main surface and a second main surface that is an opposite surface of the first main surface,
   wherein the semiconductor substrate has a first portion and a second portion,
   wherein the semiconductor substrate has:
      a collector region arranged on the second main surface located in the first portion;
      a cathode region arranged on the second main surface located in the second portion;
      a drift region arranged on the collector region and the cathode region;
      an emitter region arranged on the first main surface located in the first portion;
      a base region arranged between the emitter region and the collector region; and
      an anode region arranged on the first main surface located in the second portion,
   wherein the gate is arranged so as to interpose the gate insulating film and oppose a portion of the base region sandwiched between the emitter region and the drift region,
   wherein the first polysilicon film is arranged over the anode region,
   wherein a contact region is arranged in the first polysilicon film,
   wherein the first contact hole reaches the first polysilicon film so as to expose the contact region,
   wherein a dopant concentration in the contact region is higher than a dopant concentration in the first polysilicon film,
   wherein each conductive type of the emitter region, the emitter region, and the cathode region is an n-type, and
   wherein each conductive type of the collector region, the base region, the anode region, and the first polysilicon film is a p-type.

2. The semiconductor device according to claim 1,
   wherein a gate trench extending toward a second main surface side is formed on the first main surface located in the first portion so as to expose the emitter region, the base region, and the drift region,
   wherein the gate is embedded in the gate trench, and
   wherein the gate insulating film is arranged between the gate and each of a side surface and a bottom surface of the gate trench.

3. The semiconductor device according to claim 1,
   wherein the semiconductor substrate is arranged in the base region and further has a back gate region whose conductive type is a p-type, and wherein a dopant concentration in the anode region is lower than a dopant concentration in the back gate region.

4. The semiconductor device according to claim 1, further comprising a first insulating film arranged between the anode region and the first polysilicon film.

5. The semiconductor device according to claim 4, wherein a thickness of the first insulating film is 5 nm or less.

6. The semiconductor device according to claim 1, further comprising:
   a second insulating film; and
   a second polysilicon film,
   wherein the semiconductor substrate further has a third portion,
   wherein the second insulating film is arranged on the first main surface located in the third portion, and
   wherein the second polysilicon film is arranged on the second insulating film.

7. The semiconductor device according to claim 6, wherein the second polysilicon film configures a resistor or a diode.

\* \* \* \* \*